United States Patent
Sutardja et al.

(10) Patent No.: US 7,373,547 B2
(45) Date of Patent: *May 13, 2008

(54) SELF-REPARABLE SEMICONDUCTOR AND METHOD THEREOF

(75) Inventors: Sehat Sutardja, Los Altos Hills, CA (US); Pantas Sutardja, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,390

(22) Filed: Nov. 8, 2006

(65) Prior Publication Data

US 2007/0055906 A1 Mar. 8, 2007

Related U.S. Application Data

(62) Division of application No. 10/358,709, filed on Feb. 5, 2003.

(60) Provisional application No. 60/430,199, filed on Dec. 2, 2002.

(51) Int. Cl.
*G06F 11/00* (2006.01)

(52) U.S. Cl. .......................... 714/11; 714/56

(58) Field of Classification Search ............... 712/13, 712/20
See application file for complete search history.

(56) References Cited

U.S. PATENT DOCUMENTS

| | | | | |
|---|---|---|---|---|
| 4,566,102 A | * | 1/1986 | Hefner ............................ | 714/7 |
| 4,933,895 A | * | 6/1990 | Grinberg et al. ............ | 708/509 |
| 5,204,836 A | | 4/1993 | Reed | |
| 5,423,024 A | | 6/1995 | Cheung | |
| 5,634,067 A | * | 5/1997 | Nagazumi ..................... | 712/19 |
| 5,655,069 A | * | 8/1997 | Ogawara et al. .............. | 714/10 |

(Continued)

FOREIGN PATENT DOCUMENTS

EP 0 361 404 4/1990

(Continued)

OTHER PUBLICATIONS

Wang, Minghsien; Cutler, Michal; Su, Stephen Y.H.; Reconfiguration of VLSI/WSI Mesh Array Processors with Two-Level Redundancy, 1989, IEEE, pp. 547-550.*

(Continued)

*Primary Examiner*—Scott Baderman
*Assistant Examiner*—Paul F Contino

(57) ABSTRACT

A self-reparable semiconductor comprises first, second and spare functional units including first and second sub-functional units that cooperate to perform first and second functions. The first and second sub-functional units of the first, second and first spare functional units are functionally interchangeable, respectively. At least one of the first and second sub-functional units of the first functional unit at least one of receives and outputs an analog signal and includes an analog circuit. Switching devices communicate with the first and second sub-functional units of the first, second and first spare functional units and replace at least one of the first and second sub-functional units of at least one of the first and second functional units with at least one of the first and second sub-functional units of the first spare functional unit when the at least one of the first and second sub-functional units is non-operable.

36 Claims, 12 Drawing Sheets

U.S. PATENT DOCUMENTS

| | | | |
|---|---|---|---|
| 5,737,766 A * | 4/1998 | Tan | 711/170 |
| 5,748,872 A * | 5/1998 | Norman | 714/11 |
| 6,145,072 A * | 11/2000 | Shams et al. | 712/22 |
| 6,256,758 B1 | 7/2001 | Abramovici et al. | |
| 6,337,817 B1 | 1/2002 | Horiguchi et al. | |
| 6,363,021 B2 * | 3/2002 | Noh | 365/200 |
| 6,526,461 B1 * | 2/2003 | Cliff | 710/100 |
| 6,697,979 B1 * | 2/2004 | Vorbach et al. | 714/724 |
| 6,775,529 B1 | 8/2004 | Roo | |
| 6,785,841 B2 | 8/2004 | Akrout et al. | |
| 6,816,143 B1 * | 11/2004 | Lambert | 345/93 |
| 7,117,389 B2 | 10/2006 | Luick | |
| 2002/0133690 A1 * | 9/2002 | Yano et al. | 712/34 |
| 2003/0005377 A1 | 1/2003 | Debenham | |
| 2003/0177425 A1 | 9/2003 | Okin | |
| 2004/0123181 A1 | 6/2004 | Moon et al. | |
| 2004/0153754 A1 | 8/2004 | Chen et al. | |
| 2004/0177298 A1 * | 9/2004 | Farnworth et al. | 714/724 |
| 2004/0193939 A1 | 9/2004 | Tanaka et al. | |

FOREIGN PATENT DOCUMENTS

| | | |
|---|---|---|
| EP | 0 398 552 | 11/1990 |
| EP | 1 170 666 A3 | 6/2002 |
| EP | 1 170 666 A2 | 9/2002 |
| WO | WO 99/32975 | 1/1999 |
| WO | WO 01/39163 | 5/2001 |

OTHER PUBLICATIONS

IBM Technical Disclosure Bulletin, Yield and Reliability Enhancement Via Redundancy for VLSI Chips and Wafers, Jun. 1, 1985, pp. 1 and 2.*

Communication dated Jun. 6, 2005 from the European Patent Office for European Patent Application No. 03026882.5-2211.

Wang, Minghsien; Cutler, Michal; Su, Stephen Y.H.; Reconfiguration of VLSI/WSI Mesh Array Processors with Two-Level Redundancy, 1989, IEEE, pp. 547-550.

Notification of First Office Action dated Nov. 25, 2005 for Chinese Patent Application No. 03134804.1; 7 pages.

Notification of First Office Action from the State Intellectual Property Office of PRC dated Mar. 23, 2007 for Chinese Application No. 200410073737.2; 7 pages.

* cited by examiner

SELF-REPARABLE SEMICONDUCTOR AND METHOD THEREOF

CROSS-REFERENCE TO RELATED APPLICATIONS

This application is a divisional of U.S. patent application Ser. No. 10/358,709 filed on Feb. 5, 2003, which application claims the benefit of U.S. Provisional Application No. 60/430,199, filed on Dec. 2, 2002. The disclosures of the above applications are incorporated herein by reference.

FIELD OF THE INVENTION

The present invention relates to semiconductors, and more particularly to a self-reparable semiconductor with multiple functional units that perform the same function.

BACKGROUND OF THE INVENTION

An increasing trend in the semiconductor industry is to highly integrate an integrated circuit multiple times. For example, the semiconductor may include multiple generally independent functional units that perform the same function. Each functional unit has the same sub-functional units.

Referring now to FIG. 1, a semiconductor 8 includes M generally independent functional units 10-1, 10-2, . . . , and 10-M (collectively referred to as functional units 10) that perform the same high level function. Each functional unit 10 includes the same N sub-functional units. For example, the functional unit 10-1 includes sub-functional units 11, 21, 31, . . . , and N1. The functional unit 10-2 includes sub-functional units 12, 22, 32, . . . , and N2. The functional unit 10-M includes sub-functional units 1M, 2M, 3M, . . . , and NM. The sub-functional units in a row perform the same low level function. Typically, there are no connections between the functional units other than ground and power. There are, however, connections between the sub-functional units in a functional unit. The connections may be one-way or two-way and may include one or more connecting wires.

Referring now to FIG. 2, an exemplary functional unit may be a Gigabit physical layer device 70. For example, four or eight Gigabit physical layer devices may be fabricated on the semiconductor. The physical layer device 70 includes a first sub-functional unit 74 that performs physical coding sub-layer (PCS), Flow Control Token (FCT), and Decision Feedback Sequence Estimation (DFSE) functions. A second sub-functional unit 76 implements a finite impulse response (FIR) filter function. A third sub-functional unit 78 performs echo and near end crosstalk (NEXT) functions. Fourth and fifth sub-functional units 80 and 84 implement digital and analog front end (AFE) functions, respectively.

If the yield for each individual functional unit is 90%, then the yield for the semiconductor with x identical functional units is $(0.9)^x$. For example, if a semiconductor includes eight functional units each having a yield of 90%, the yield of the semiconductor is 43%, which is not an acceptable yield.

SUMMARY OF THE INVENTION

A self-reparable semiconductor according to the invention includes a first functional unit with first and second sub-functional units that cooperate to perform a first function. A second functional unit includes first and second sub-functional units that also cooperate to perform the first function. A first spare functional unit includes first and second sub-functional units. The first sub-functional units of the first, second and first spare functional units are functionally interchangeable. The second sub-functional units of the first, second and first spare functional units are functionally interchangeable. Switching devices communicate with the first and second sub-functional units of the first, second and first spare functional units and replace at least one of the first and second sub-functional units of at least one of the first and second functional units with at least one of the first and second sub-functional units of the first spare functional unit when the at least one of the first and second sub-functional units is non-operable.

In other features, a controller identifies non-operable sub-functional units and operates the switching devices to replace the non-operable sub-functional units.

In still other features, the first and second functional units are laid out in one of columns and rows and the first and second sub-functional units of the first and second functional units are laid out in the other of columns and rows.

In other features, the spare functional unit is located one of between the first and second functional units and next to one of the first and the second functional units.

In yet other features, a second spare functional unit includes first and second sub-functional units. The first sub-functional units of the first, second, first spare and second spare functional units are functionally interchangeable. The second sub-functional units of the first, second, first spare and second spare functional units are functionally interchangeable.

In still other features, the first, second, first spare and second spare functional units are laid out in one of columns and rows and the first and second sub-functional units of the first, second, first spare and second spare functional units are laid out in the other of columns and rows. The first and second sub-functional units of the first and second spare functional units and the switching devices are capable of replacing two non-operable sub-functional units that perform the same function and that are located in one of the same row and the same column.

In yet other features, at least one of the switching devices includes a multiplexer that receives p inputs and outputs q outputs where q is less than p. A demultiplexer receives q inputs and outputs p outputs. A switch selectively connects the q outputs of the multiplexer to the p inputs of the demultiplexer.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figures 1, 2:
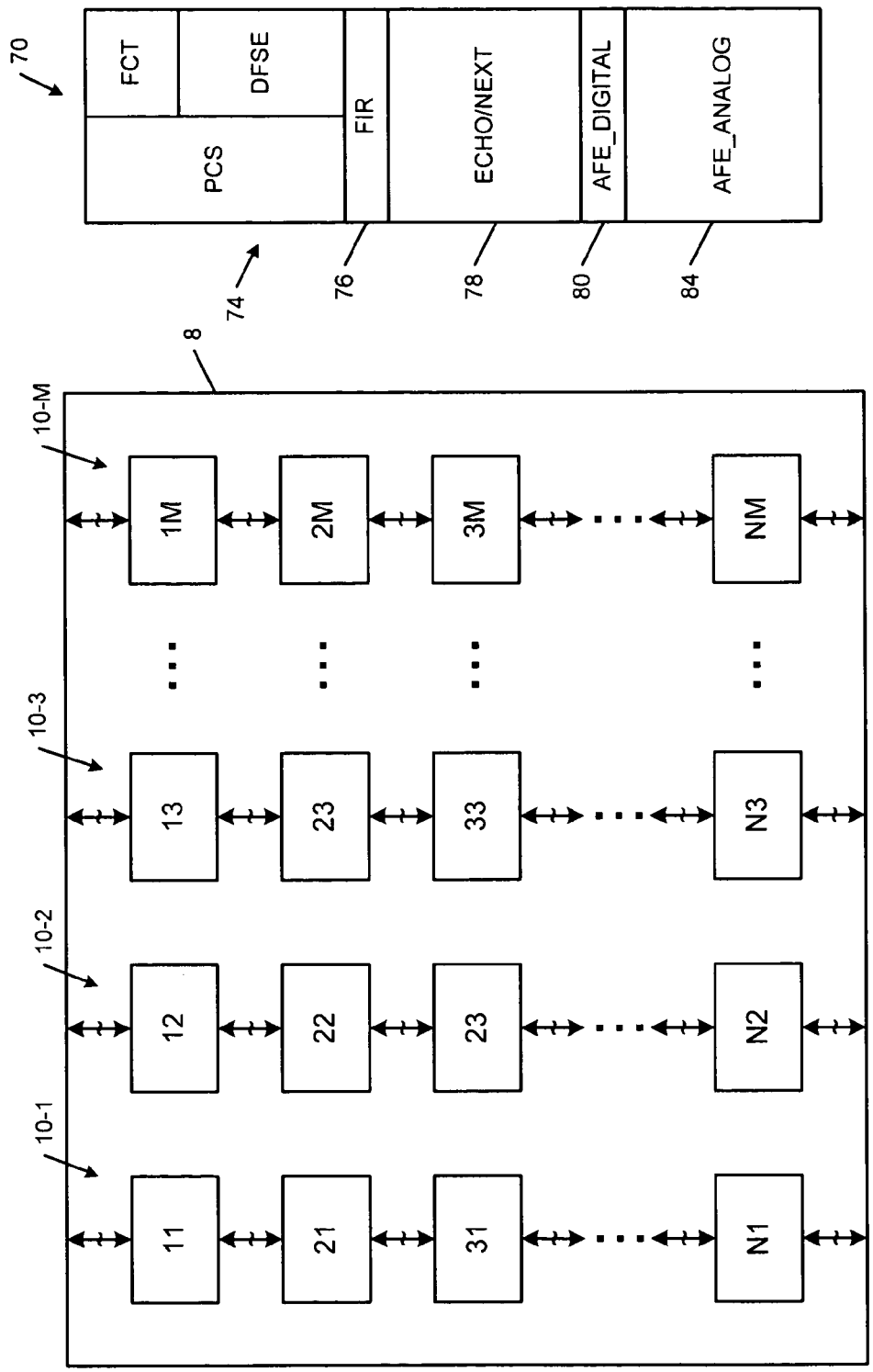
FIG. 1 is a functional block diagram of a semiconductor including multiple functional units each with sub-functional units according to the prior art.
FIG. 2 is a functional block diagram of an exemplary functional unit for a Gigabit physical layer device according to the prior art.

The following description of the preferred embodiment(s) is merely exemplary in nature and is in no way intended to limit the invention, its application, or uses. For purposes of clarity, the same reference numbers will be used in the drawings to identify similar elements.

A self-reparable semiconductor according to the present invention includes one or more full or partial spare functional units. If a defect in a functional unit or a sub-functional unit is detected, then that functional unit or sub-functional unit is switched out and replaced with a functional unit or sub-functional unit in the full or partial spare functional unit. The reconfiguration is realized with switching devices that may be integrated with or separate from the functional or sub-functional units.

Defective functional or sub-functional units can be detected after assembly, during power up, periodically during operation, and/or manually. While the present invention will be described in conjunction with specific examples, skilled artisans will appreciate that each semiconductor may include any number of functional units that perform the same high-level function. The functional units may include any number of common sub-functional units.

Figure 13:
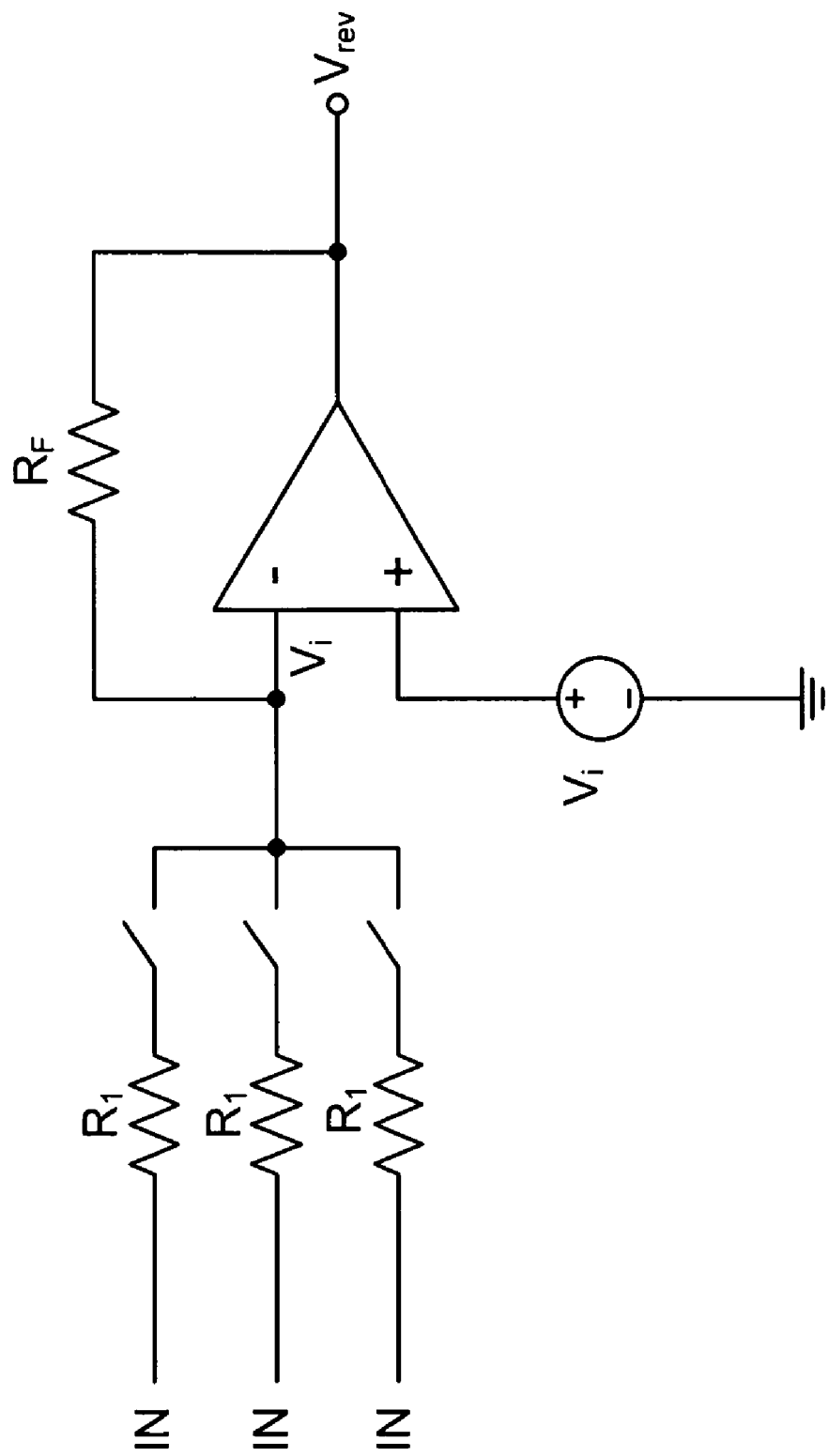
FIG. 13 is an example of a summing node switch.

In addition, while specific switching devices and arrangements are shown, the specific switching devices and arrangements that will be used will depend upon the particular implementation, details of the particular functional and/or sub-functional units and other normal design criteria. Similar or different types of switching devices may be used on the same semiconductor to replace the non-operable functional and/or sub-functional units. When the connecting wires between subfunctional units carry analog signals, analog switching is performed which preferably employs current-switching devices, generally for analog output signals and summing node switching for analog input signals. Such switching devices have several advantages over voltage-based switching devices such as reduced attenuation, lower impedance and lower distortion. FIG. 13 shows an example of summing node switching. Summing node switching provides for input analog signals, which may be greater than Vdd or negative. In contrast to voltage mode switching, voltage signals greater than Vdd or negative may cause the switching transistor to become forward biased. A further explanation of active summing devices may be found in commonly assigned application Ser. No. 09/629,092, filed Jul. 31, 2000 and entitled "Active Resistance Summer For A Transformer Hybrid", the contents of which are incorporated herein by reference.

Digital switching devices may be employed for connecting wires carrying digital signals. These type of switches include for example, standard logic devices, gates, muxes, transistors and the like.

Figure 3B:
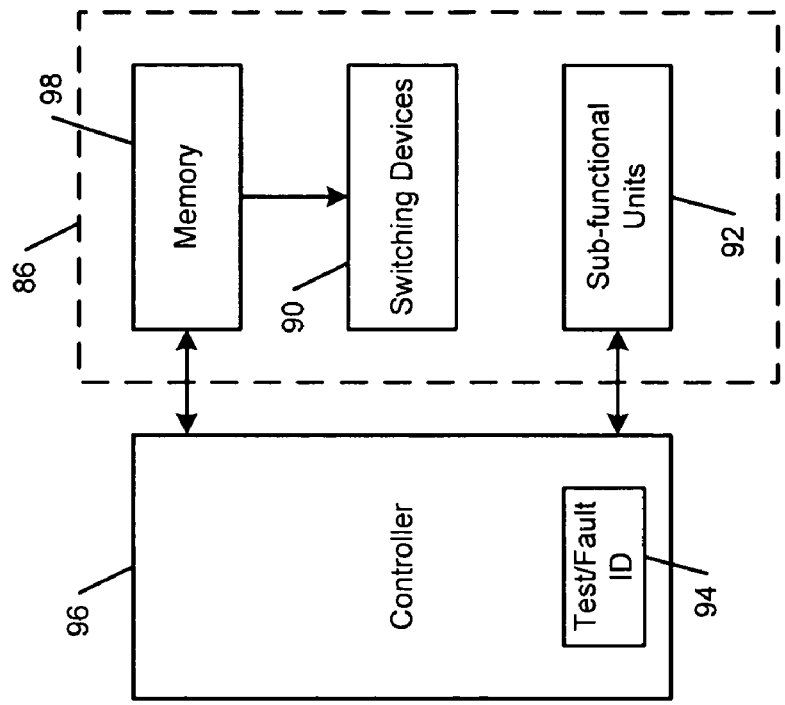
FIG. 3B is a functional block diagram of an off-chip controller that commands the switching devices and optionally includes a test/fault detection circuit.
Figure 3A:
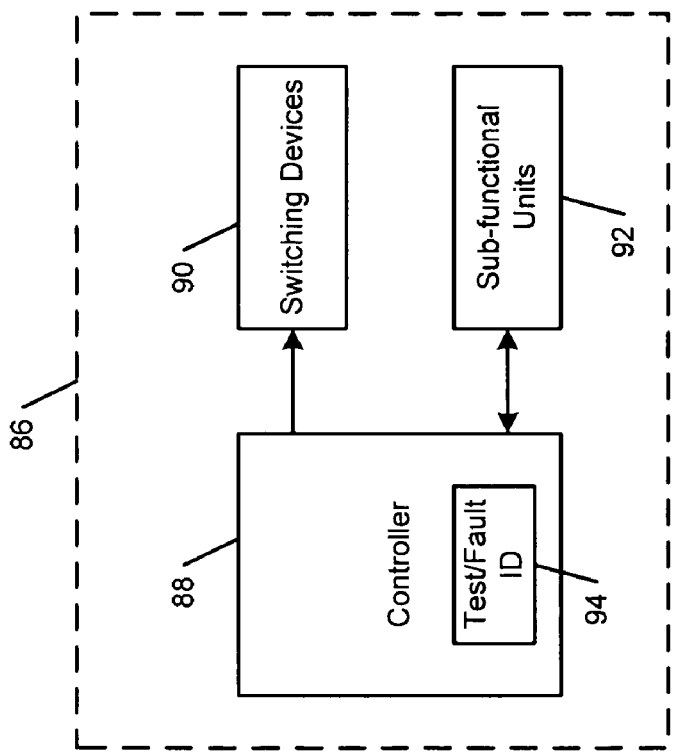
FIG. 3A is a functional block diagram of an on-chip controller that commands the switching devices and optionally includes a test/fault detection circuit.

Referring now to FIG. 3A, a semiconductor 86 of each of the embodiments can include a controller 88 that is located on-chip and that communicates with the switching devices 90 and the sub-functional units 92. A test or fault identification circuit 94 identifies non-operable sub-functional units 92 and generates configuration data. The controller 88 commands the switching devices 90 to replace the non-operable sub-functional units 92 as previously described. The controller 88 may execute a built-in self test mode after assembly, during power up, periodically during operation, and/or manually.

Referring now to FIG. 3B, a semiconductor 86 of each of the embodiments can include a controller 96 that is located off-chip and that is removably connected to on-chip memory 98, such as non-volatile memory. The memory 98 stores configuration data defining switch positions for the switching devices 90. The controller 96 is connected to the sub-functional units 92 and detects and/or tests for failures. The controller 96 uses the test results to define the configuration data that is then stored in the memory 98. When powered on, the configuration data is used to configure the sub-functional units 92. As can be appreciated, there are a variety of other ways to implement the switching devices. For example, fuses, such as laser fuses or anti-fuses, can be used to make and/or break connections to replace functional units and/or sub-functional units. External pins or dip switches can also be used.

Figure 4:
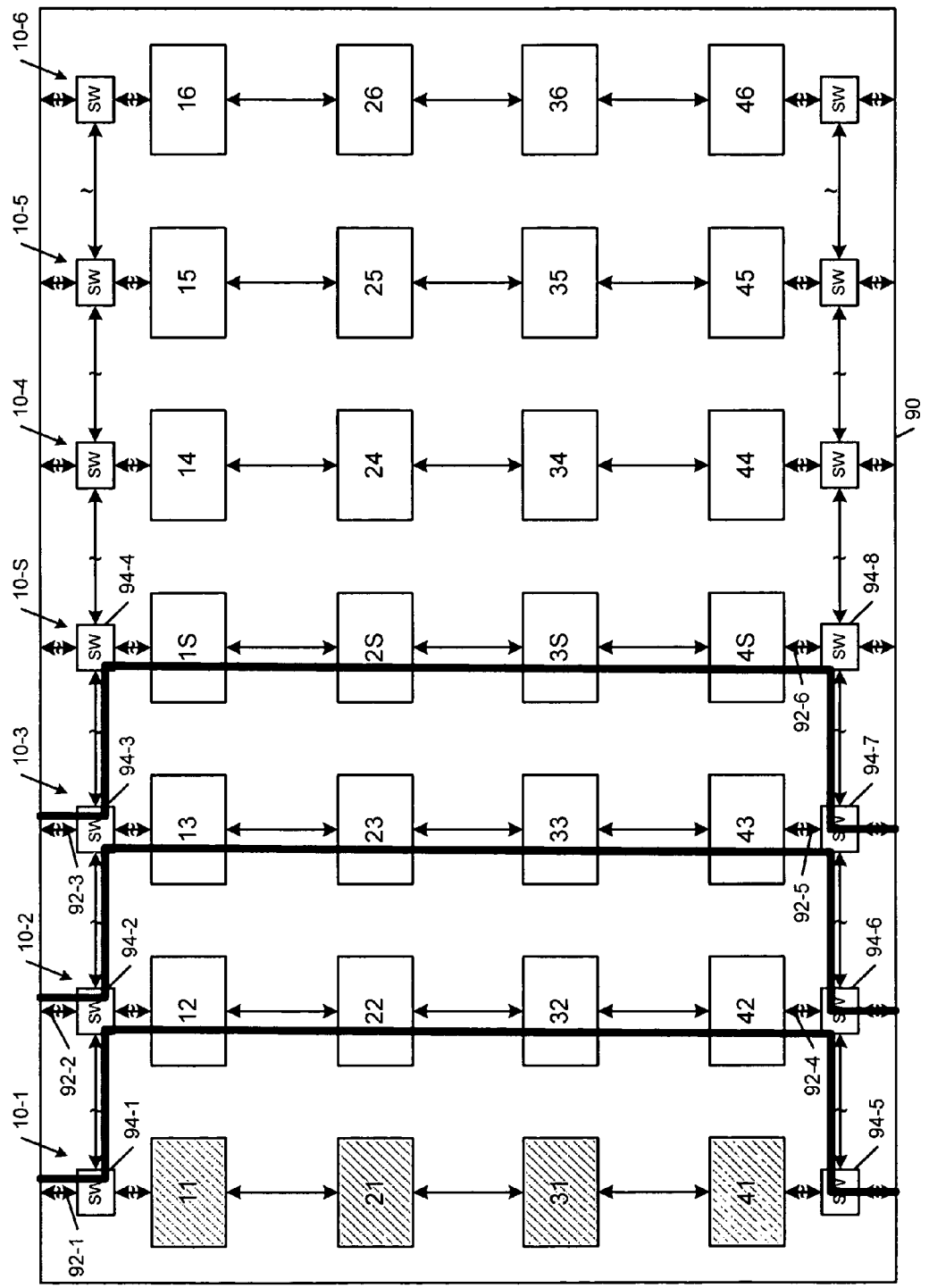
FIG. 4 is a functional block diagram of a first exemplary self-reparable semiconductor including a spare functional unit that replaces a non-operable functional unit according to the present invention.

Referring now to FIG. 4, a spare functional unit 10-S is fabricated on a semiconductor 90 in addition to the functional units 10-1, 10-2, . . . , and 10-6. In addition, switching devices 94 are located at inputs and outputs of some or all of the sub-functional units. In the exemplary embodiment illustrated in FIG. 3, the spare functional unit 10-S is located between the functional units 10. As can be appreciated, however, the spare functional unit 10-S can be located in any position on the semiconductor 100. For example, the spare functional unit 10-S can be located to the left or right of any of the functional units 10.

The switching devices 94 and the spare functional unit 10-S allow the semiconductor 90 to replace non-operable functional units 10-1, 10-2, 10-3, 10-4, 10-5 and/or 10-6. In the example in FIG. 4, the spare functional unit 10-S allows any number of sub-functional units in one functional unit to fail. By allowing the replacement of non-operable functional units, the yield of the semiconductor 90 is significantly improved. If one or any combination of the sub-functional units 11, 21, 31, and/or 41 in the functional unit 10-1 fail (as shown by cross-hatched shading), the switches 94 are reconfigured to replace the non-operable sub-functional units 11, 21, 31, and 41 with the sub-functional units in the spare functional unit 10-S.

For example, if the sub-functional unit 11 is non-operable, the inputs 92-1, 92-2, and 92-3 to the sub-functional units 11, 12, and 13 are shifted one functional unit to the right by switches 94-1, 94-2, 94-3, and 94-4. The outputs 92-4, 92-5, and 92-6 of the sub-functional units 42, 43, and 4S are shifted one functional unit to the left by switches 94-5, 94-6, 94-7, and 94-8.

After reconfiguration, the first functional unit 10-1 includes sub-functional units 12, 22, 32, and 42. The second functional unit 10-2 includes sub-functional units 13, 23, 33, and 43. The third functional unit 10-3 includes sub-functional units 1S, 2S, 3S, and 4S. The fourth functional unit 104 includes sub-functional units 14, 24, 34, and 44. The fifth functional unit 10-5 includes sub-functional units 15, 25, 35, and 45. The sixth functional unit 10-6 includes sub-functional units 16, 26, 36, and 46. This exemplary embodiment allows replacement on a functional unit basis only.

Figure 5:
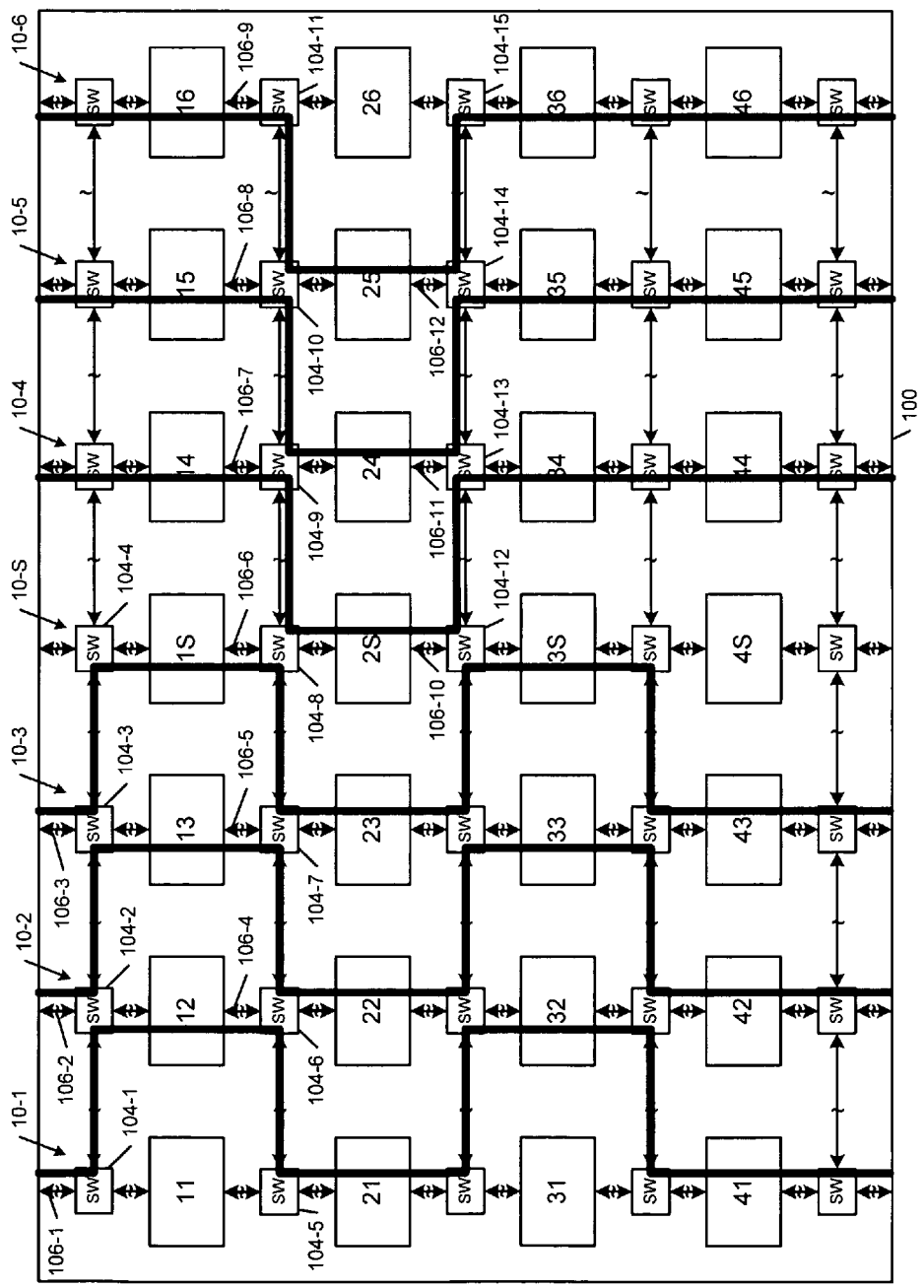
FIG. 5 is a functional block diagram of a second exemplary self-reparable semiconductor with a spare functional unit that replaces one or more non-operable sub-functional units according to the present invention.

Referring now to FIG. 5, a spare functional unit 10-S is fabricated on a semiconductor 100 in addition to the functional units 10-1, 10-2, . . . , and 10-6. In addition, switching devices 104 are located at inputs and outputs of the sub-functional units. In the exemplary embodiment illustrated in FIG. 5, the spare functional unit 10-S is located between the functional units 10.

The switching devices 104 and the spare functional unit 10-S allow the semiconductor 100 to replace non-operable sub-functional units in the functional units 10-1, 10-2, 10-3, 10-4, 10-5 and/or 10-6. In the example in FIG. 5, the spare functional unit 10-S allows one sub-functional unit in each row to fail. By allowing the replacement of non-operable sub-functional units, the yield of the semiconductor 100 is significantly improved. This exemplary embodiment allows replacement on a functional unit or a sub-functional unit basis and/or replacement of multiple sub-functional units in different functional units.

If the sub-functional units 11, 31 and 26 fail (as shown in shading), the switches 104 are reconfigured to replace the non-operable sub-functional units 11, 31 and 26 with sub-functional units 15, 35 and 25, respectively, in the spare functional unit 10-S.

The non-operable sub-functional unit 11 is replaced as follows: The inputs 106-1, 106-2, and 106-3 to the sub-functional units 11, 12, and 13 are shifted one functional unit to the right by switches 104-1, 104-2, 104-3, and 104-4. The outputs 106-4, 106-5, and 106-6 of the sub-functional units 12, 13, and 1S are shifted one functional unit to the left by switches 104-5, 104-6, 104-7, and 104-8. The non-operable sub-functional unit 13 is replaced in a similar manner.

The non-operable sub-functional unit 26 is replaced as follows: The outputs 106-7, 106-8, and 106-9 of the sub-functional units 14, 15, and 16 are shifted one functional unit to the left by switches 104-9, 104-10, and 104-11. The outputs 106-10, 106-11, and 106-12 of the sub-functional units 2S, 24, and 25 are shifted one functional unit to the right by switches 104-12, 104-13, 104-14, and 104-15.

After reconfiguration, the first functional unit 10-1 includes sub-functional units 12, 21, 32, and 41. The second functional unit 10-2 includes sub-functional units 13, 22, 33, and 42. The third functional unit 10-3 includes sub-functional units 1S, 23, 3S, and 43. The fourth functional unit 10-4 includes sub-functional units 14, 2S, 34, and 44. The fifth functional unit 10-5 includes sub-functional units 15, 24, 35, and 45. The sixth functional unit 10-6 includes sub-functional units 16, 25, 36, and 46.

Figure 6:
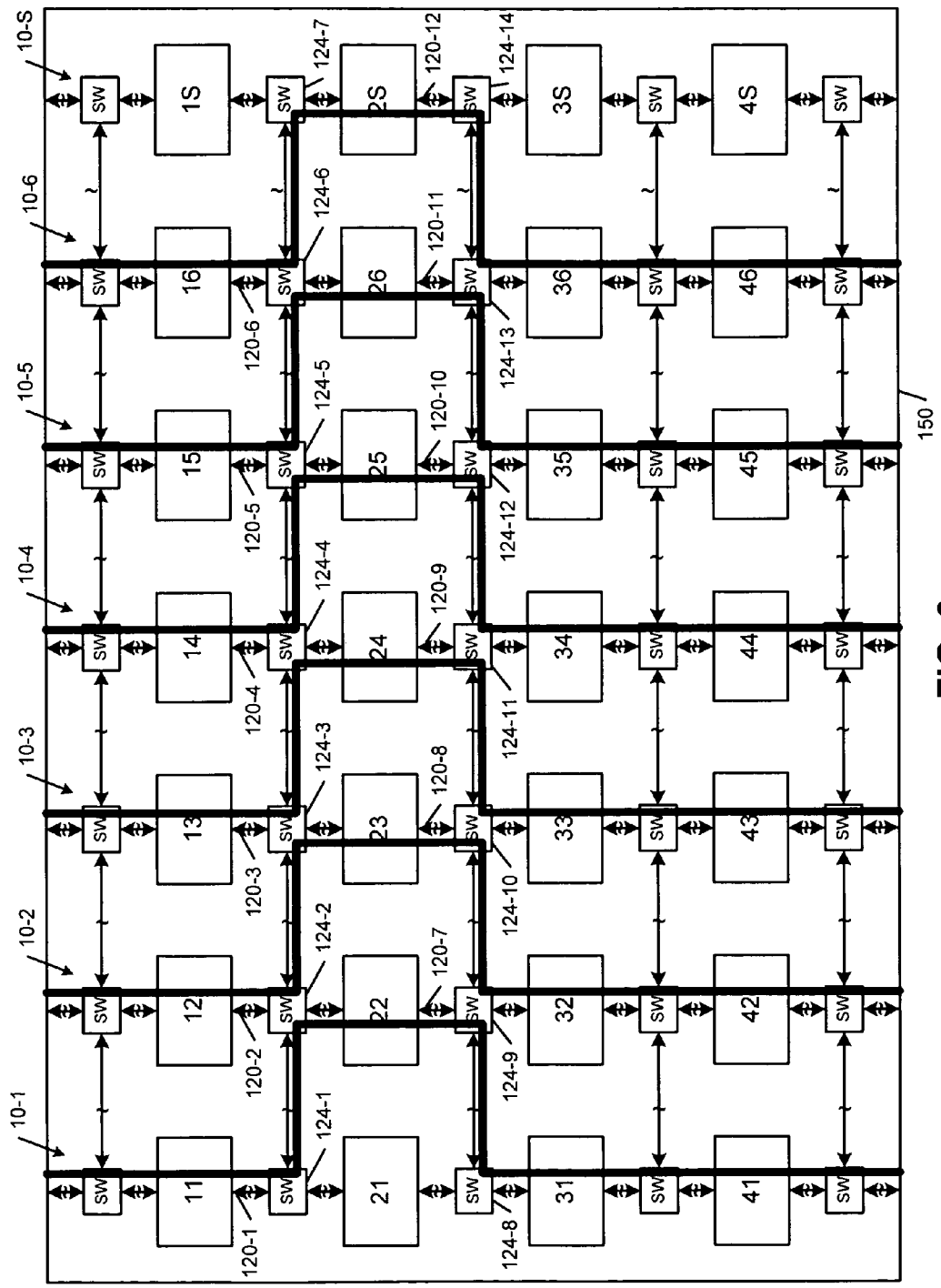
FIG. 6 is a functional block diagram of a third exemplary self-reparable semiconductor including a spare functional unit located at one end according to the present invention.

Referring now to FIG. 6, a semiconductor 150 includes the spare sub-functional unit 10-S that is located at one end. If the sub-functional unit 21 fails (as shown in shading), the inputs 120-1, 120-2, . . . , and 120-6 to the sub-functional units 21, 22, . . . , and 26 are shifted one functional unit to the right by switches 124-1, 124-2, . . . , and 124-7. The outputs 120-7, 120-8, . . . , and 120-12 of the sub-functional units 22, 23, . . . and 2S are shifted one functional unit to the left by switches 124-8, 124-9, . . . , and 124-14.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 24, 33, and 43. The fourth functional unit 10-4 includes sub-functional units 14, 25, 34, and 44. The fifth functional unit 10-5 includes sub-functional units 15, 26, 35, and 45. The sixth functional unit 10-6 includes sub-functional units 16, 2S, 36, and 46.

Figure 7:
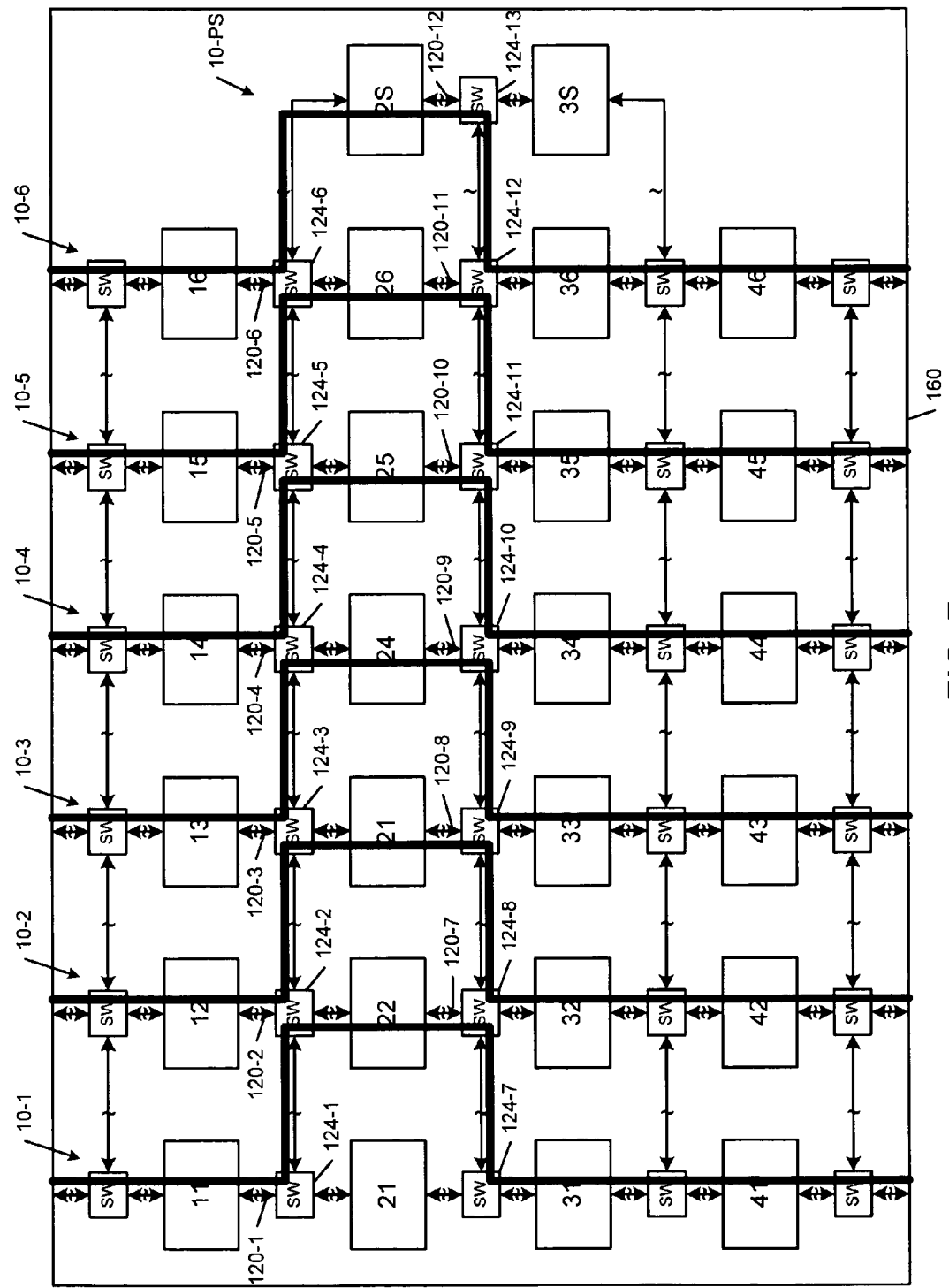
FIG. 7 is a functional block diagram of a fourth exemplary self-reparable semiconductor including a partial spare functional unit according to the present invention.

Referring now to FIG. 7, a semiconductor 160 includes a partial spare sub-functional unit 10-PS that is located at one end. The partial spare sub-functional unit 10-PS includes one or more sub-functional units (for some but not all of the sub-functional units). For example, the partial sub-functional unit 10-PS includes sub-functional units 2S and 3S but not 1S or 4S. The partial sub-functional units that are provided may be associated with sub-functional units that are more likely to have a lower yield. By not fabricating the other sub-functional units and switches, the cost of the semiconductor 160 may be reduced.

If the sub-functional unit 21 fails (as shown in shading), the inputs 120-1, 120-2, . . . , and 120-6 to the sub-functional units 21, 22, . . . , and 26 are shifted one functional unit to the right by switches 124-1, 124-2, . . . , and 124-6. The outputs 120-7, 120-8, . . . , and 120-12 of the sub-functional units 22, 23, . . . and 2S are shifted one functional unit to the left by switches 124-8, 124-9, . . . , and 124-13.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 24, 33, and 43. The fourth functional unit 10-4 includes sub-functional units 14, 25, 34, and 44. The fifth functional unit 10-5 includes sub-functional units 15, 26, 35, and 45. The sixth functional unit 10-6 includes sub-functional units 16, 2S, 36, and 46.

Figure 8:
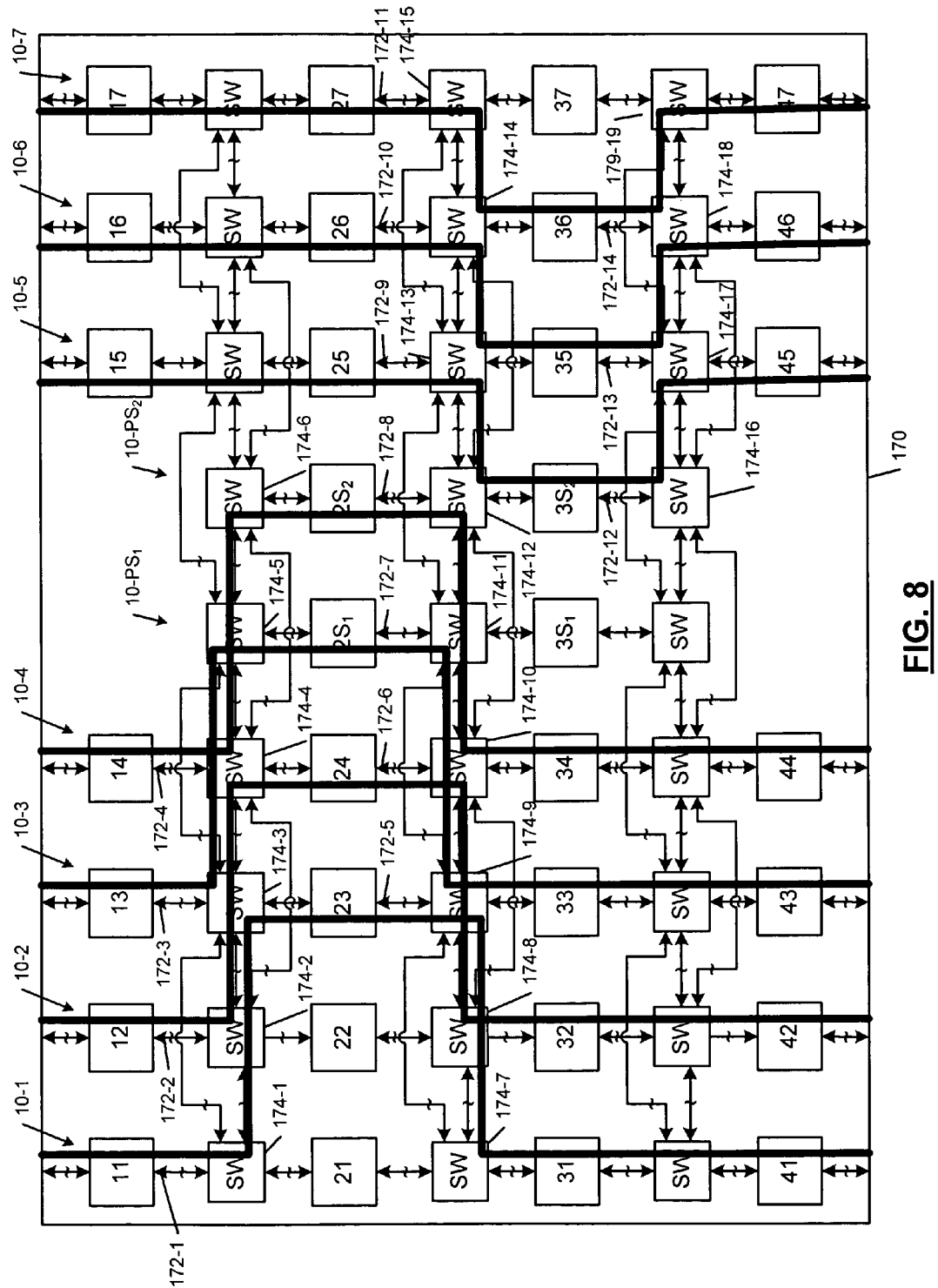
FIG. 8 is a functional block diagram of a fifth exemplary self-reparable semiconductor including two partial spare functional units located in the middle according to the present invention.

Referring now to FIG. 8, additional full and/or partial spare functional units can be provided. For example, a semiconductor 170 in FIG. 8 includes two partial spare sub-functional units $10\text{-}PS_1$, and $10\text{-}PS_2$. The full and/or partial spare sub-functional units $10\text{-}PS_1$, and $10\text{-}PS_2$ can be located adjacent to each other (as shown) or in non-adjacent positions. If the full or partial sub-functional units are located adjacent to each other, switches 172 switch inputs and/or outputs between two adjacent switches. For example, the switch 174-1 can switch inputs and/or outputs from sub-functional unit 11 to either sub-functional unit 22 or 23.

If the sub-functional units 21 and 22 fail (as shown in shading), the inputs 172-1, 172-2, 172-3, and 172-4 to the sub-functional units 21, 22, 23 and 24 are shifted two functional units to the right by switches 174-1, 174-2, . . . , and 174-6. The outputs 172-5, 172-6, . . . , and 172-8 of the sub-Express functional units 23, 24, 2S$_1$, and 2S$_2$ are shifted two functional units to the left by switches 174-7, 174-8, . . . , and 174-12.

If the sub-functional unit 37 fails, the inputs 172-9, 172-10, and 172-11 to the sub-functional units 35, 36, and 37 are shifted one functional unit to the left by switches 174-12, 174-13, 174-14, and 174-15. The outputs 172-12, 172-13, and 172-14 of the sub-functional units 3S$_2$, 35, and 36 are shifted one functional unit to the right by switches 174-16, 174-17, 174-18, and 174-19.

After reconfiguration, the first functional unit 10-1 includes sub-functional units 11, 23, 31, and 41. The second functional unit 10-2 includes sub-functional units 12, 24, 32, and 42. The third functional unit 10-3 includes sub-functional units 13, 2S$_1$, 33, and 43. The fourth functional unit 10-4 includes sub-functional units 14, 2S$_2$, 34, and 44. The fifth functional unit 10-5 includes sub-functional units 15, 25, 3S$_2$, and 45. The sixth functional unit 10-6 includes sub-functional units 16, 26, 35, and 46. The seventh functional unit 10-7 includes sub-functional units 17, 27, 36, and 47.

Figure 9:
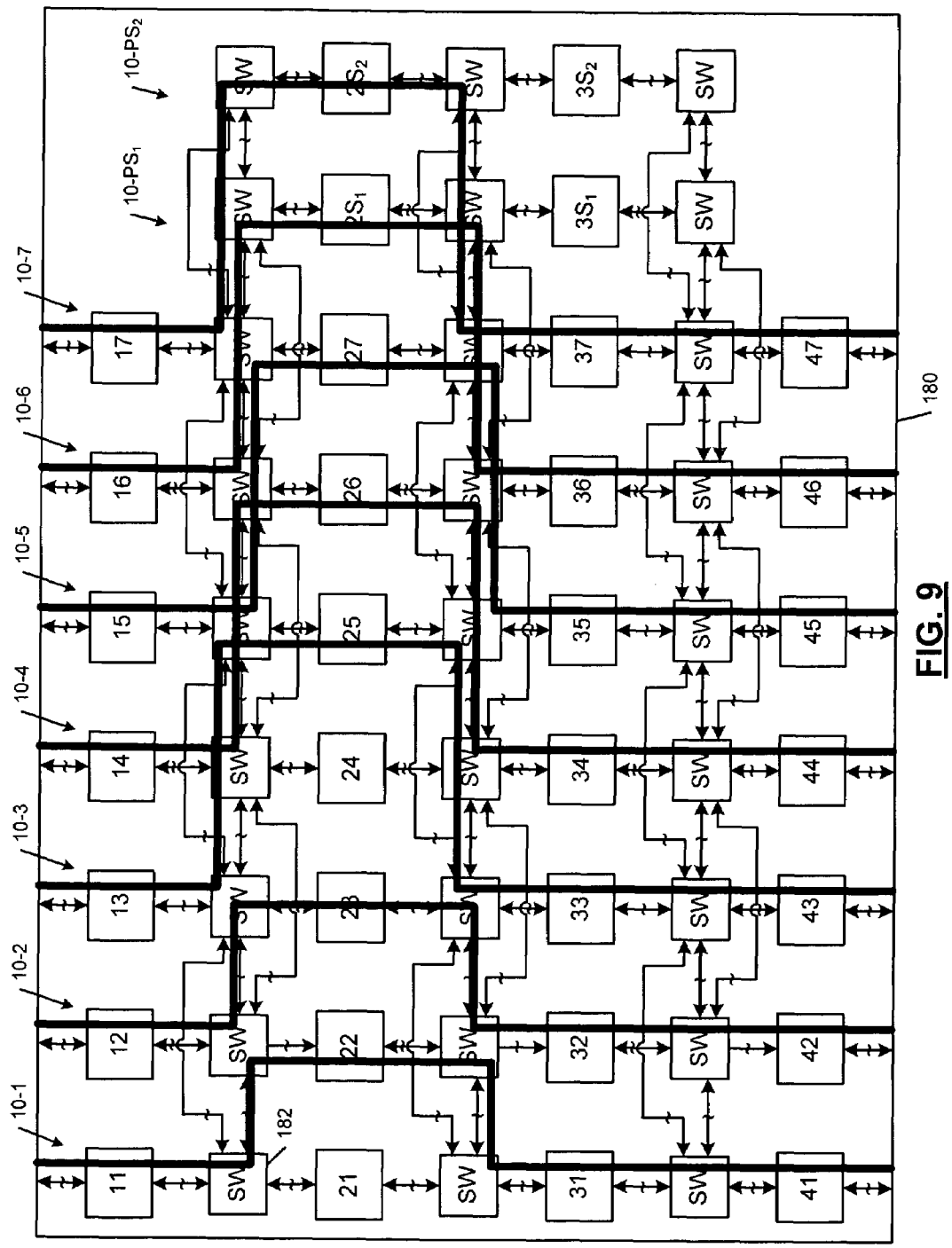
FIG. 9 is a functional block diagram of a sixth exemplary self-reparable semiconductor including two partial spare functional units located at one end according to the present invention.

The semiconductor can also include two or more full and/or partial functional units that are located at one end or in any other position. In FIG. 9, two partial spare functional units 10-PS$_1$, and 10-PS$_2$ are located at one end of a semiconductor 180. If sub-functional units 21 and 24 fail (as shown in shading), the switching devices 182 replace them with sub-functional units 2S$_1$, and 2S$_2$ in the spare functional units 10-PS$_1$ and 10-PS$_2$.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 25, 33, and 43. The fourth functional unit 10-4 includes sub-functional units 14, 26, 34, and 44. The fifth functional unit 10-5 includes sub-functional units 15, 27, 35, and 45. The sixth functional unit 10-6 includes sub-functional units 16, 2S$_1$, 36, and 46. The seventh functional unit 10-7 includes sub-functional units 17, 2S$_2$, 37, and 47.

Figure 10:
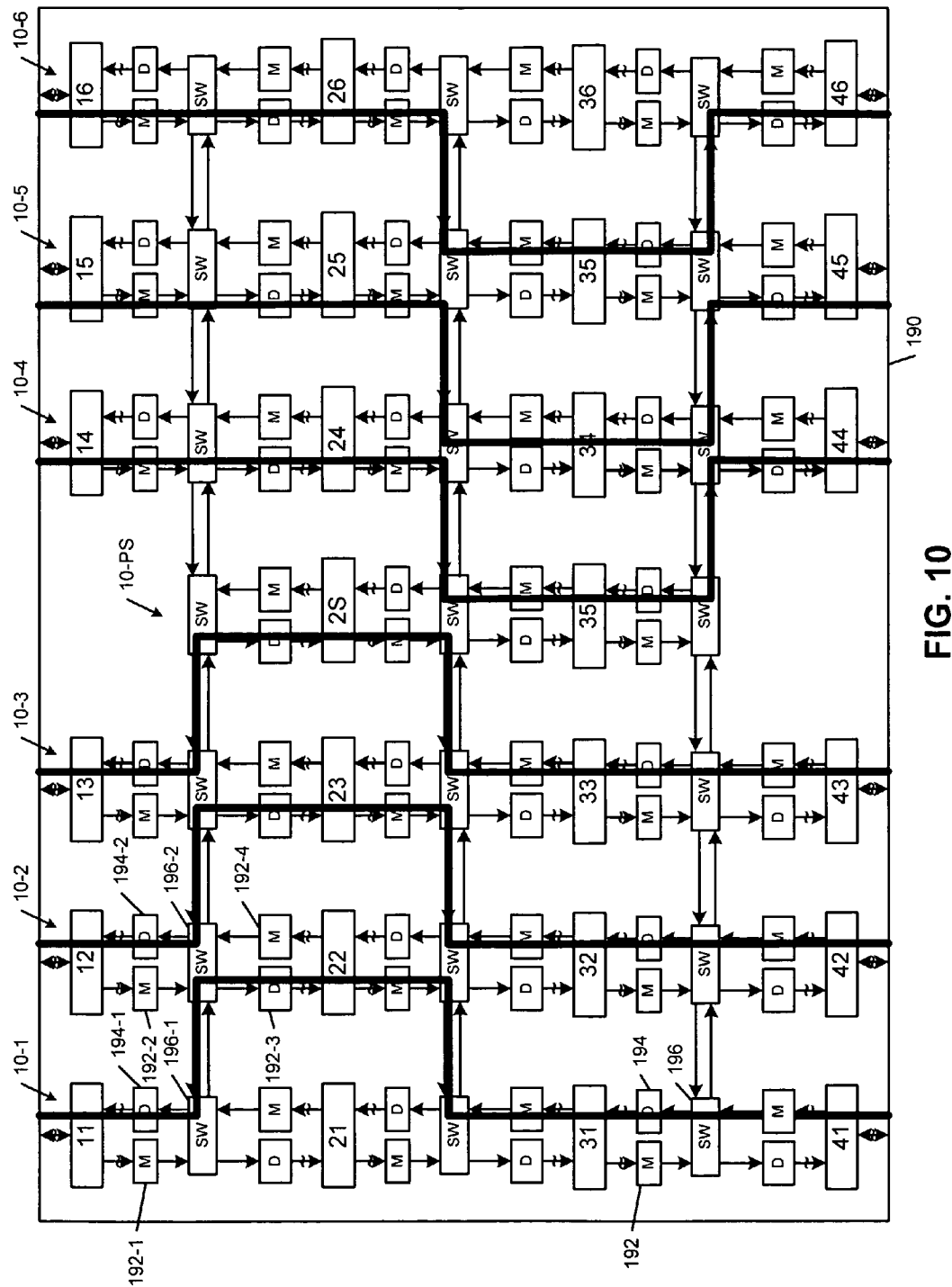
FIG. 10 is a functional block diagram of a seventh exemplary self-reparable semiconductor including a partial spare functional unit and multiplexed switching devices according to the present invention.

Referring now to FIG. 10, to reduce the complexity of the switching devices, the semiconductor 190 includes multiplexed switching devices that include multiplexers (M) 192 that receive p input signals and that output1 to q output signals, where q is less than p. For example, p input signals can be multiplexed into one output signal.

Alternately, the p input signals can be multiplexed into two or more output signals. For example, eight input signals can be multiplexed into three output signals. In this example, one input signal is not multiplexed, for example a high speed signal such as data signals in the Gigabit physical layer device. Two medium speed signals can be multiplexed into one output signal. The remaining five input signals, which are preferably "slow" signals such as control signals in the Gigabit PHY, can be multiplexed into one output signal.

Figure 11:
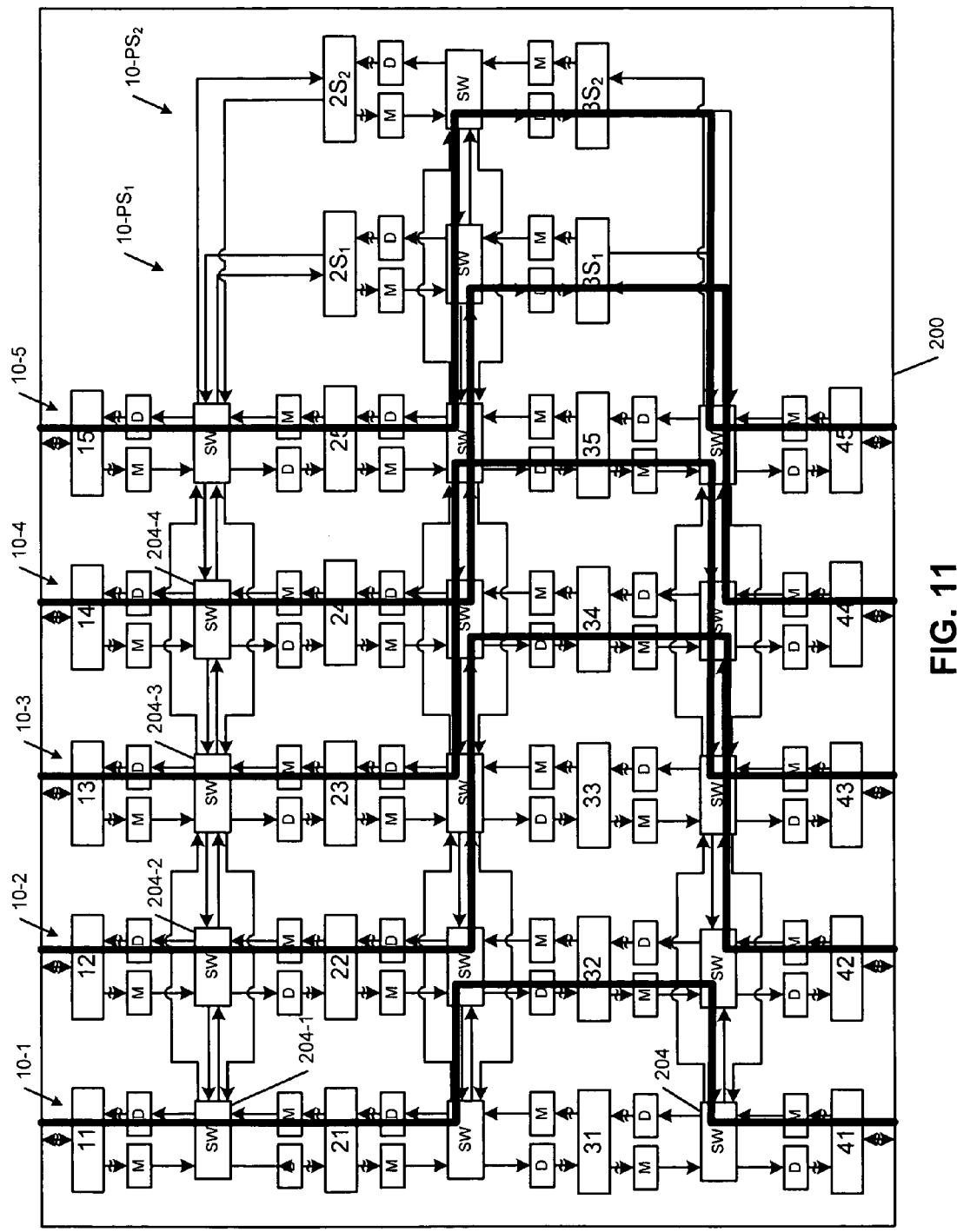
FIG. 11 is a functional block diagram of an eighth exemplary self-reparable semiconductor including multiple functional units each with sub-functional units, two partial spare functional units and multiplexed switching devices according to the present invention.

Demultiplexers (D) 194 receive 1 to q input signals and generate p output signals. The number of inputs and outputs that are multiplexed and demultiplexed will depend upon the particular sub-functional units that communicate with the multiplexers 192 and demultiplexers 194. By decreasing the number of connecting wires that need to be switched, the switching devices can be simplified. The exemplary embodiments shown in FIGS. 10 and 11 show multiple inputs that are multiplexed to a single output. Based on the preceding discussion, however, skilled artisans will appreciate that the output of the multiplexer may include one or more outputs that may be multiplexed or not multiplexed.

For example, if the sub-functional unit 21 fails, the switching devices 196-1 and 196-2 connect the multiplexer 192-1 with the demultiplexer 192-3. This establishes a forward path for signals being sent from the sub-functional unit 11 to the sub-functional unit 22 (which replaces non-operable sub-functional unit 21 ). The demultiplexer 192-3 communicates with the sub-functional unit 22. Likewise, a reverse path can be established if needed. The switching devices 196-1 and 196-2 connect the multiplexer 192-4 to the demultiplexer 194-1, which communicates with the sub-functional unit 11. As can be appreciated, while forward and reverse signal paths are shown, forward and/or reverse paths may be used between the sub-functional units as needed. Some of the multiplexers and demultiplexers can be omitted if both forward and reverse paths are not used between sub-functional units.

After failure and reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 2S, 33, and 43. The fourth functional unit 10-4 includes sub-functional units 14, 24, 3S, and 44. The fifth functional unit 10-5 includes sub-functional units 15, 25, 34, and 45. The sixth functional unit 10-6 includes sub-functional units 16, 26, 35, and 46.

The semiconductor with multiplexed switching devices can include multiple full or partial spare sub-functional units. Referring now to FIG. 11, a semiconductor 200 includes two partial spare sub-functional units 10-PS$_1$ and 10-PS$_2$. The multiple full or partial spare sub-functional units need not be located adjacent to each other. Switching devices 204 connect to at least two adjacent switches. For example, the switching device 204-1 communicates with the switching devices 204-2 and 204-3. Likewise, the switching device 204-2 communicates with the switching devices 204-3 and 204-4. The semiconductor 200 is capable of replacing two failures in the same row.

For example, if sub-functional units 31 and 33 fail (as shown in shading), the switches 204 are reconfigured. The first functional unit 10-1 includes sub-functional units 11, 21, 32, and 41. The second functional unit 10-2 includes sub-functional units 12, 22, 34, and 42. The third functional unit 10-3 includes sub-functional units 13, 23, 35, and 43. The fourth functional unit 104 includes sub-functional units 14, 24, 3S$_1$, and 44. The fifth functional unit 10-5 includes sub-functional units 15, 25, 3S$_2$, and 45.

Assuming that defects are uniformly and independently distributed on the semiconductor (which may or may not be true), if the yield for a single functional unit is P$_S$, then the yield for a first sub-functional unit is P$_{sub1}$=P$_S$((area of sub-functional unit)/area of functional unit)). The yield P$_S$ of the functional unit is equal to the product of the yields for each sub-functional unit.

If p is the yield of the functional units, m is the minimum number of working functional units and n is equal to m plus the number of spare functional units, the yield is defined as follows:

$$\text{yield} = f(p, m, n) = \sum_{x=m}^{n} p^x (1-p)^{n-x} \frac{n!}{x!(n-x)!}$$

For example, a semiconductor with 8 functional units each having a uniform yield of 90% (and spare functional units) would have a yield of 43%. Assume that the functional units have four sub-functional blocks A, B, C, and D. All of the sub-functional blocks are swapped out as a group if A, B, C and/or D experience a fault. With one spare functional unit, the yield increases to 77.5%.

If the functional blocks can be swapped out in two groups (A and B) and/or (C and D), the yield is equal to:

$$\text{yield} = f(p_A \times p_B, m, n) \times f(p_C \times p_D, m, n)$$

In this example, the yield increases to 85.6%.

If the functional blocks can be swapped out in three groups (A and B), C and/or D, the yield is equal to:

$$\text{yield} = f(p_A \times p_B, m, n) \times f(p_C, m, n) \times f(p_D, m, n)$$

In this example, the yield increases to 88.6%.

If the functional blocks can be swapped out in four groups A, B, C and/or D, the yield is equal to:

$$\text{yield} = f(p_A, m, n) \times f(p_B, m, n) \times f(p_C, m, n) \times f(p_D, m, n)$$

In this example, the yield increases to 91.7%.

As can be appreciated, providing one spare functional unit increase yield dramatically. Splitting the functional units into two or more sub-functional units that can be individually swapped out further increases yield. At some point, the tradeoff between improved yield is offset by increased design complexity.

Figure 12:
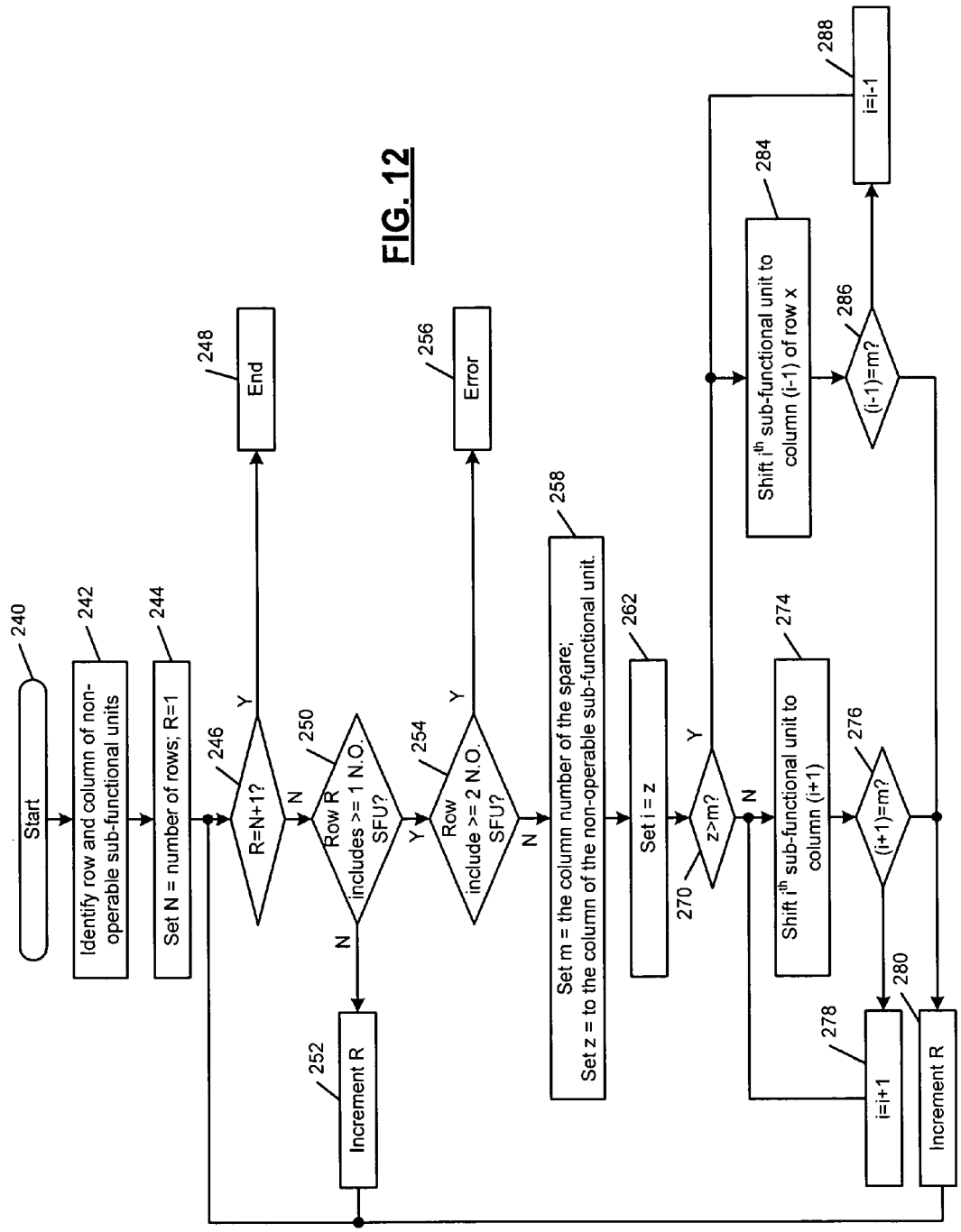
FIG. 12 is a flowchart illustrating steps for replacing non-operable sub-functional units with sub-functional units in a single spare functional unit.

Referring now to FIG. 12, steps of a method for replacing non-operable sub-functional units using a single full or partial functional unit is shown. Control begins with step 240. In step 242, control identifies rows and columns of non-operable sub-functional units. In step 244, control sets N equal to the number of rows in the functional units and sets R equal to one. In step 246, control determines whether R is equal to N+1. If true, control ends in step 248. If false, control continues with step 250 where control determines if row R has greater than or equal to one non-operable (N.O.) sub-functional unit (SFU). If false, control increments R in step 252 and control returns to step 246. If true, control continues with step 254 where control determines if row R includes greater than or equal to two non-operable (N.O.) sub-functional units (SFU). Since only one spare full or partial sub-functional unit is provided, an error is signaled in step 256 if two or more non-operable sub-functional units are in the same row.

In step 258, control sets m equal to the column number of the full or partial spare functional unit and z equal to the column of the non-Express operable sub-functional unit. In step 262, control sets i=z. In step 270, control determines whether z>m. If false, control continues with step 274 and shifts the $i^{th}$ sub-functional unit to column (i+1) using the switching devices. In step 276, control determines whether (i+1)=m. If not, control increments i in step 278 and continues with step 274. Otherwise, control increments R in step 280 and control continues with step 254.

If z is greater than m in step 270, control continues with step 284 and shifts the $i^{th}$ sub-functional unit to column (i−1) using the switching devices. In step 286, control determines whether (i−1) is equal to m. If not, control decrements i in step 288 and continues with step 284. Otherwise, control continues with step 280.

As can be appreciated by skilled artisans, similar algorithms for replacing non-operable functional units and/or sub-functional units can be performed for semiconductors including two or more full or partial spare functional units and/or sub-functional units. In addition, while specific switching arrangements are shown, the specific switching devices that will be used will depend upon the particular implementation, details of the particular functional and/or sub-functional units and other normal design criteria. Various different types of switching devices may also be used on the same semiconductor.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A self-reparable semiconductor, comprising:
   a first functional unit including first and second sub-functional units that cooperate to perform a first function;
   a second functional unit including first and second sub-functional units that also cooperate to perform said first function;
   a first spare functional unit including first and second sub-functional units, wherein said first sub-functional units of said first, second and first spare functional units are functionally interchangeable, and wherein said second sub functional units of said first, second and first spare functional units are functionally interchangeable, wherein at least one of said first and second sub-functional units of each of said first functional unit, said second functional unit, and said first spare functional unit at least one of receives and outputs an analog signal and includes an analog circuit, wherein said analog signal includes at least one of a Gigabit data signal and a Gigabit control signal; and
   switching devices that communicate with said first and second sub-functional units of said first, second and first spare functional units and that replace at least one of said first and second sub-functional units of at least one of said first and second functional units with at least one of said first and second sub-functional units of said first spare functional unit when said at least one of said first and second sub-functional units is non-operable, wherein said switching devices selectively multiplex said analog signals based on whether said analog signals include one of said Gigabit data signal and said Gigabit control signal.

2. The self-reparable semiconductor of claim 1 further comprising:
   a controller that identifies at least one non-operable sub-functional unit and that generates configuration data for configuring said switching devices to replace said at least one non-operable sub-functional unit.

3. The self-reparable semiconductor of claim 2 wherein said controller is located on said self-reparable semiconductor.

4. The self-reparable semiconductor of claim 2 wherein said controller is located off said self-reparable semiconductor and further comprising memory located on said self-reparable semiconductor for storing said configuration data for said switching devices.

5. The self-reparable semiconductor of claim 1 wherein said first and second functional units are laid out in one of columns and rows and said first and second sub-functional units of said first and second functional units are laid out in the other of columns and rows.

6. The self-reparable semiconductor of claim 1 wherein said spare functional unit is located one of between said first and second functional units and next to one of said first and said second functional units.

7. The self-reparable semiconductor of claim 1 further comprising a second spare functional unit including first and second sub-functional units, wherein said first sub-functional units of said first, second, first spare and second spare functional units are functionally interchangeable, and wherein said second sub-functional units of said first, second, first spare and second spare functional units are functionally interchangeable.

8. The self-reparable semiconductor of claim 7 wherein said first, second, first spare and second spare functional units are laid out in one of columns and rows and said first and second sub-functional units of said first, second, first spare and second spare functional units are laid out in the other of columns and rows.

9. The self-reparable semiconductor of claim 8 wherein said first and second sub-functional units of said first and second spare functional units and said switching devices are capable of replacing two non-operable sub-functional units that perform the same function and that are located in one of the same row and the same column.

10. The self-reparable semiconductor of claim 1 wherein at least one of said switching devices includes:
   a multiplexer that receives p inputs and outputs q outputs, where q is less than p;
   a demultiplexer that receives q inputs and outputs p outputs; and
   a switch that selectively connects said q outputs of said multiplexer to q inputs of said demultiplexer.

11. The self-reparable semiconductor of claim 1 wherein said switching devices include at least one of analog and digital switching devices.

12. The self-reparable semiconductor of claim 11 wherein said analog switching device comprises at least one of a current based switching device and a summing node switching device.

13. A self-reparable semiconductor, comprising:
   first functional means for performing a first function and including first and second sub-functional means for performing first and second subfunctions, respectively;
   second functional means for performing said first function and including first and second sub-functional means for performing said first and second sub-functions, respectively;
   spare functional means for replacing non-operable sub-functional means and including first and second sub-functional means for performing said first and second sub-functions, respectively, wherein at least one of said first and second sub-functional means of each of said first functional means, said second functional means, and said spare functional means at least one of receives and outputs an analog signal and includes an analog circuit, wherein said analog signal includes at least one of a Gigabit data signal and a Gigabit control signal; and
   switching means for replacing at least one of said first and second sub-functional means of at least one of said first and second functional means with at least one of said first and second sub-functional means of said first spare functional means when said at least one of said first and second sub-functional means is non-operable, wherein said switching means selectively multiplexes said analog signals based on whether said analog signals include one of said Gigabit data signal and said Gigabit control signal.

14. The self-reparable semiconductor of claim 13 further comprising: control means for identifying at least one non-operable subfunctional means and for generating configuration data that configures said switching means to replace said at least one non-operable sub-functional means.

15. The self-reparable semiconductor of claim 14 wherein said control means is located on said self-reparable semiconductor.

16. The self-reparable semiconductor of claim 14 wherein said control means is located off said self-reparable semiconductor and further comprising storage means located on said self-reparable semiconductor for storing said configuration data for said switching means.

17. The self-reparable semiconductor of claim 13 wherein said first and second functional means are laid out in one of columns and rows and said first and second sub-functional means of said first and second functional means are laid out in the other of columns and rows.

18. The self-reparable semiconductor of claim 13 wherein said spare functional means is located one of between said first and second functional means and next to one of said first and said second functional means.

19. The self-reparable semiconductor of claim 13 further comprising a second spare functional means for replacing non-operable sub-functional means and including first and second sub-functional means for performing said first and second sub-functions, respectively.

20. The self-reparable semiconductor of claim 19 wherein said first, second, first spare and second spare functional means are laid out in one of columns and rows and said first and second sub-functional means of said first, second, first spare and second spare functional means are laid out in the other of columns and rows.

21. The self-reparable semiconductor of claim 20 wherein said first and second sub-functional means of said first and second spare functional means and said switching devices are capable of replacing two non-operable sub functional means that perform the same function and that are located in one of the same row and the same column.

22. The self-reparable semiconductor of claim 13 wherein at least one of said switching means includes:
   multiplexing means for receiving p inputs and outputting q outputs, where q is less than p; and
   demultiplexing means for receiving q inputs and outputting p outputs; and
   switch means for selectively connecting said q outputs of said multiplexing means to said q inputs of said demultiplexing means.

23. The self-reparable semiconductor of claim 13 wherein said switching means includes at least one of analog and digital switching devices.

24. The self-reparable semiconductor of claim 23 wherein said analog switching devices comprises at least one of a current based switching device and a summing node switching device.

25. A method of operating a self-reparable semiconductor, comprising: performing a first function using a first functional unit having first and second sub-functional units;
   performing said first function using a second functional unit having first and second sub-functional units;
   providing a first spare functional unit on said self-reparable semiconductor including first and second sub-functional units, wherein said first sub-functional units of said first, second and first spare functional units are functionally interchangeable, and wherein said second sub-functional units of said first, second and first spare functional units are functionally interchangeable, wherein at least one of said first and second sub-functional units of each of said first functional unit, said second functional unit, and said first spare functional unit at least one of receives and outputs an analog signal and includes an analog circuit;

replacing at least one of said first and second sub-functional units of at least one of said first and second functional units with at least one of said first and second sub-functional units of said first spare functional unit when said at least one of said first and second sub-functional units is non-operable; and selectively multiplexing said analog signals based on whether said analog signals include one of a Gigabit data signal and a Gigabit control signal.

26. The method of claim 25 further comprising:
identifying at least one non-operable sub-functional unit; and
generating configuration data that replaces said at least one non-operable sub-functional unit.

27. The method of claim 26 further comprising locating a controller on said self-reparable semiconductor.

28. The method of claim 26 further comprising:
locating a controller off said self-reparable semiconductor; and
storing said configuration data in memory located on said selfreparable semiconductor.

29. The method of claim 25 further comprising laying out said first and second functional units in one of columns and rows and said first and second sub-functional units of said first and second functional units in the other of columns and rows.

30. The method of claim 25 further comprising locating said spare functional units one of between said first and second functional units and next to one of said first and said second functional units.

31. The method of claim 25 further comprising providing a second spare functional unit including first and second sub-functional units, wherein said first sub-functional units of said first, second, first spare and second spare functional units are functionally interchangeable, and wherein said second subfunctional units of said first, second, first spare and second spare functional units are functionally interchangeable.

32. The method of claim 31 further comprising laying out said first, second, first spare and second spare functional units in one of columns and rows and said first and second sub-functional units of said first, second, first spare and second spare functional units in the other of columns and rows.

33. The method of claim 32 further comprising replacing two non-operable sub-functional units that perform the same functional unit and that are located in one of the same row and the same column.

34. The method of claim 25 further comprising reducing switching of connecting wires using a multiplexer and a demultiplexer.

35. The method of claim 25 further comprising using at least one of analog and digital switching devices to replace non-operable sub-functional units.

36. The method of claim 25 wherein said replacing step comprises at least one of:
current switching analog signals; and summing node switching the analog signals.

* * * * *

UNITED STATES PATENT AND TRADEMARK OFFICE
CERTIFICATE OF CORRECTION

PATENT NO. : 7,373,547 B2  Page 1 of 1
APPLICATION NO. : 11/594390
DATED : May 13, 2008
INVENTOR(S) : Sehat Sutardja et al.

It is certified that error appears in the above-identified patent and that said Letters Patent is hereby corrected as shown below:

| | |
|---|---|
| Column 5, Line 23 | Delete "104" and insert -- 10-4 -- |
| Column 7, Line 4 | Delete "sub-Express functional" and insert -- sub-functional -- |
| Column 7, Line 47 | Delete "output1" and insert -- output 1 -- |
| Column 8, Line 48 | Delete "104" and insert -- 10-4 -- |
| Column 9, Line 50 | Delete "non-Express operable" and insert -- non-operable -- |

Signed and Sealed this

Twenty-sixth Day of August, 2008

JON W. DUDAS
*Director of the United States Patent and Trademark Office*